(12) United States Patent
Lee

(10) Patent No.: US 9,852,815 B2
(45) Date of Patent: Dec. 26, 2017

(54) SEMICONDUCTOR MEMORY DEVICE AND MEMORY SYSTEM INCLUDING THE SAME

(71) Applicant: Samsung Electronics Co., Ltd., Suwon-si, Gyeonggi-do (KR)

(72) Inventor: Ho-Jun Lee, Uiwang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/296,428

(22) Filed: Oct. 18, 2016

(65) Prior Publication Data

US 2017/0200512 A1 Jul. 13, 2017

(30) Foreign Application Priority Data

Jan. 8, 2016 (KR) .................. 10-2016-0002705

(51) Int. Cl.
*G11C 17/16* (2006.01)
*G11C 29/00* (2006.01)
*G11C 7/06* (2006.01)
*G11C 7/10* (2006.01)

(52) U.S. Cl.
CPC ............. *G11C 29/78* (2013.01); *G11C 7/06* (2013.01); *G11C 7/1012* (2013.01); *G11C 17/16* (2013.01)

(58) Field of Classification Search
CPC ......... G11C 7/06; G11C 7/1012; G11C 17/16; G11C 29/78
USPC ........................................................... 365/96
See application file for complete search history.

(56) References Cited

U.S. PATENT DOCUMENTS

| | | | |
|---|---|---|---|
| 6,229,750 B1 * | 5/2001 | Correale, Jr. | G11C 7/1039 365/154 |
| 6,304,500 B1 | 10/2001 | Kyung et al. | |
| 6,680,857 B2 | 1/2004 | Mueller et al. | |
| 6,937,515 B2 | 8/2005 | Sudo et al. | |
| 7,236,397 B2 | 6/2007 | Kim | |
| 8,576,638 B2 | 11/2013 | Kim et al. | |
| 2006/0109715 A1 * | 5/2006 | Lee | G11C 16/10 365/185.17 |
| 2009/0109724 A1 * | 4/2009 | Buer | G11C 17/18 365/96 |

(Continued)

FOREIGN PATENT DOCUMENTS

| | | |
|---|---|---|
| KR | 19970051325 | 7/1997 |
| KR | 0172748 | 3/1999 |

(Continued)

*Primary Examiner* — Huan Hoang
*Assistant Examiner* — Minh Dinh
(74) *Attorney, Agent, or Firm* — Harness, Dickey & Pierce, P.L.C.

(57) ABSTRACT

A semiconductor memory device includes a normal memory block including a plurality of normal memory cells, a redundant memory block including a plurality of redundant memory cells used to replace defective cells among the normal memory cells, a normal buffer block configured to sense and amplify data stored in the normal memory block, a redundant buffer block configured to sense and amplify data stored in the redundant memory block, a normal latch block configured to fetch data from the normal buffer block and store the data based on a normal control signal, and a redundant latch block configured to selectively fetch data from the redundant buffer block and store the data based on a redundant control signal.

19 Claims, 13 Drawing Sheets

(56) References Cited

U.S. PATENT DOCUMENTS

| | | | | |
|---|---|---|---|---|
| 2010/0157704 A1* | 6/2010 | Iwaki | ...................... | G11C 29/84 365/200 |
| 2015/0325316 A1* | 11/2015 | Kang | ...................... | G11C 29/76 365/96 |
| 2016/0170853 A1* | 6/2016 | Lo | ........................... | G11C 29/76 714/6.22 |

FOREIGN PATENT DOCUMENTS

| | | |
|---|---|---|
| KR | 10-0314649 | 12/2001 |
| KR | 20100115123 A | 10/2010 |
| KR | 20110082274 A | 7/2011 |

\* cited by examiner

SEMICONDUCTOR MEMORY DEVICE AND MEMORY SYSTEM INCLUDING THE SAME

CROSS-REFERENCE TO RELATED APPLICATIONS

This application claims priority under 35 U.S.C. §119(a) from Korean Patent Application No. 10-2016-0002705 filed on Jan. 8, 2016, the disclosure of which is hereby incorporated by reference in its entirety.

BACKGROUND

Example embodiments of the inventive concepts relate to a semiconductor memory device and/or a memory system including the same. For example, at least some example embodiments relate to a semiconductor memory device for selectively controlling the operation of a redundant latch and/or a memory system including the same.

When even single one of memory cells in a semiconductor memory device, such as dynamic random access memory (DRAM), has a defect, the whole semiconductor memory device may be classified as a poor product. At this time, discarding all of the memory cells may be inefficient in terms of yield. To avoid such inefficiency and increase the yield, a redundant memory cell may be provided in the semiconductor memory device and the memory cell which fails, i.e., a defective cell may be replaced with the redundant memory cell.

When a read operation is performed on the defective cell, the defective cell may be replaced with a redundant memory cell included in a redundant memory block, so that the defective cell can be repaired. For example, when a normal column line is connected to the defective cell, the whole of the normal column may be replaced with a redundant column line included in the redundant memory block. At this time, the one normal column line can be repaired by being replaced with the one redundant column line.

Generally, when the read operation is performed on data stored in a memory cell, a row decoder may enable a row line (e.g., a word line) containing the memory cell in a memory cell array, and the data may be sensed by a sense amplifier and stored in a latch block. The latch block may store and process a plurality of data to implement a prefetch. The prefetch is an operation of reading or writing a plurality of data at each access to a memory cell, for example, to increase a memory access rate.

When data is transmitted to the latch block, fast speed may be required. Accordingly, normal data and redundant data are stored in a latch and then column repair is implemented through address comparison. However, when the column repair is not used, unnecessary transmission of the redundant data from the redundant memory block may occur at each read operation. Such unnecessary transmission may lead to the occurrence of unnecessary power consumption.

SUMMARY

According to some example embodiments of the inventive concepts, a semiconductor memory device may include a normal memory block including a plurality of normal memory cells, a redundant memory block including a plurality of redundant memory cells used to replace defective cells among the normal memory cells, a normal buffer block configured to sense and amplify data stored in the normal memory block, a redundant buffer block configured to sense and amplify data stored in the redundant memory block, a normal latch block configured to fetch data from the normal buffer block and store the data based on a normal control signal, and a redundant latch block configured to selectively fetch data from the redundant buffer block and store the data based on a redundant control signal.

According to other example embodiments of the inventive concepts, a memory system may include a plurality of semiconductor memory devices and a memory controller configured to control the semiconductor memory devices. Each of the semiconductor memory devices may include a memory cell array including a plurality of normal memory cells and a plurality of redundant memory cells each for replacing a defective cell among the normal memory cells, a sense amplifier configured to sense and amplify data stored in the memory cell array, a latch block configured to fetch and store data from the sense amplifier based on a normal control signal and a redundant control signal, a control circuit configured to output the normal control signal and the redundant control signal to the latch block, and an OTP memory configured to store a repair signal. The sense amplifier may include a plurality of redundant buffers configured to sense and amplify data stored in the redundant memory cells and the latch block may include a plurality of redundant latches configured to access corresponding buffers among the redundant buffers.

According to other example embodiments of the inventive concepts, a semiconductor memory device, may include a latch block including a plurality of normal latches and a plurality of redundant latches, the plurality of redundant latches configured to selectively fetch redundant data from repair cells included in redundant memory cells based on a redundant control signal; and a controller configured to selectively provide the redundant control signal to ones of the plurality of redundant latches based on a repair signal, the repair signal indicating which of the plurality of redundant latches are connected to the repair cells.

BRIEF DESCRIPTION OF THE DRAWINGS

The above and other features and advantages of the example embodiments of the inventive concepts will become more apparent by describing in detail some example embodiments thereof with reference to the attached drawings in which.

DETAILED DESCRIPTION

Figure 1:
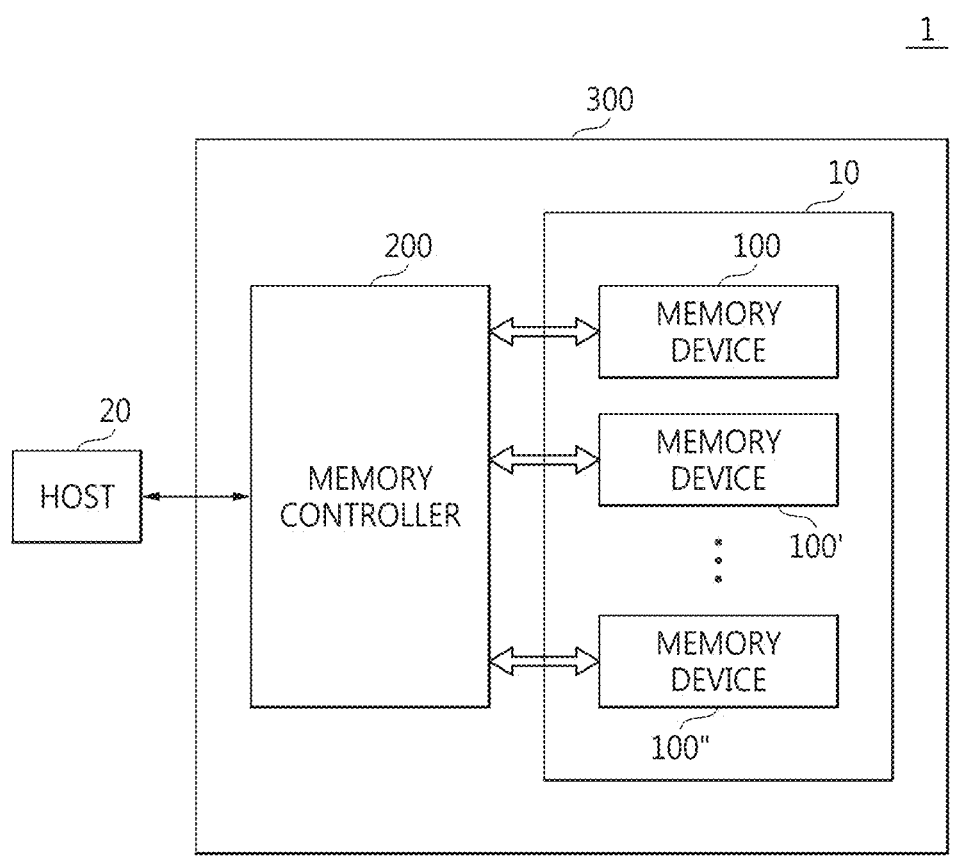
FIG. 1 is a schematic block diagram of an electronic system according to some example embodiments of the inventive concepts.

Example embodiments of the inventive concepts now will be described more fully hereinafter with reference to the accompanying drawings, in which some example embodiments are shown. The example embodiments may, however, be embodied in many different forms and should not be construed as limited to the example embodiments set forth herein. Rather, these example embodiments are provided so that this disclosure will be thorough and complete, and will fully convey the scope of the example embodiments to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular example embodiments only and is not intended to be limiting of the example embodiments. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which these example embodiments belong. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a schematic block diagram of an electronic system 1 according to some embodiments of the inventive concept. The electronic system 1 may include a host 20 and a memory system 300.

The host 20 may communicate with the memory system 300 using an interface protocol such as peripheral component interconnect express (PCI-E), advanced technology attachment (ATA), serial ATA (SATA), parallel ATA (PATA), or serial attached SCSI (SAS). However, the interface protocol between the host 20 and the memory system 300 is not restricted to these examples and may be other interface protocols. For example, the interface protocol may be a universal serial bus (USB) interface protocol, a multimedia card (MMC) interface protocol, an enhanced small disk interface (ESDI) protocol, and an integrated drive electronics (IDE) interface protocol.

The memory system 300 may include a memory controller 200 and a memory module 10. The memory controller 200 may control the overall operation of the memory system 300. It may also control data exchange between the host 20 and the memory module 10.

The memory module 10 may include a plurality of semiconductor memory devices 100, 100', and 100". The semiconductor memory devices 100, 100', and 100" are implemented as dynamic random access memory (DRAM) including a memory cell array (not shown) in which a plurality of memory cells are arranged in rows and columns in the example embodiments described herein, but example embodiments of the inventive concepts are not restricted to these example embodiments.

When the semiconductor memory devices 100, 100', and 100" are implemented as DRAM, the memory module 10 may be implemented as an unbuffered dual in-line memory module (UDIMM), a registered DIMM (RDIMM), or a load reduced DIMM (LR-DIMM). At this time, the memory module 10 may also include a buffer (not shown) or a register (not shown). The memory system 300 may be installed in a system such as mobile equipment, a notebook computer, or a desktop computer, but example embodiments of the inventive concepts are not restricted to these examples.

Figure 2:
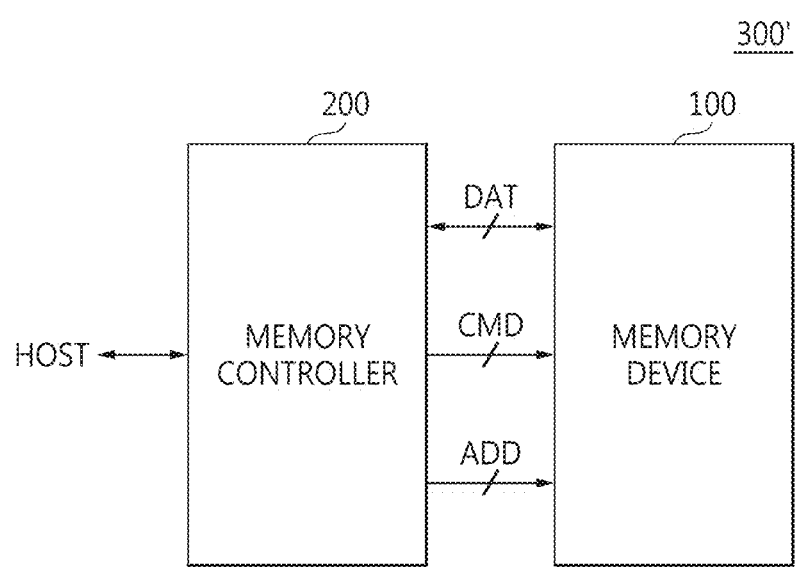
FIG. 2 is a schematic block diagram of a memory system according to some example embodiments of the inventive concepts.

FIG. 2 is a schematic block diagram of a memory system 300' according to some example embodiments of the inventive concepts. In FIG. 2, only one semiconductor memory device 100 corresponding to the memory controller 200 will be described as an example, but example embodiments of the inventive concepts are not restricted thereto.

Referring to FIG. 2, the memory controller 200 may input data DAT to the semiconductor memory device 100 or receive the data DAT from the semiconductor memory device 100 in response to a request of the host 20. The memory controller 200 may consecutively perform an operation of transmitting an address signal ADD and a command CMD for an active operation of the semiconductor memory device 100 to the semiconductor memory device 100, an operation of transmitting the address signal ADD and a command CMD for a write/read operation to the semiconductor memory device 100, and an operation of transmitting the address signal ADD and a command CMD for a refresh operation to the semiconductor memory device 100.

Figure 3:
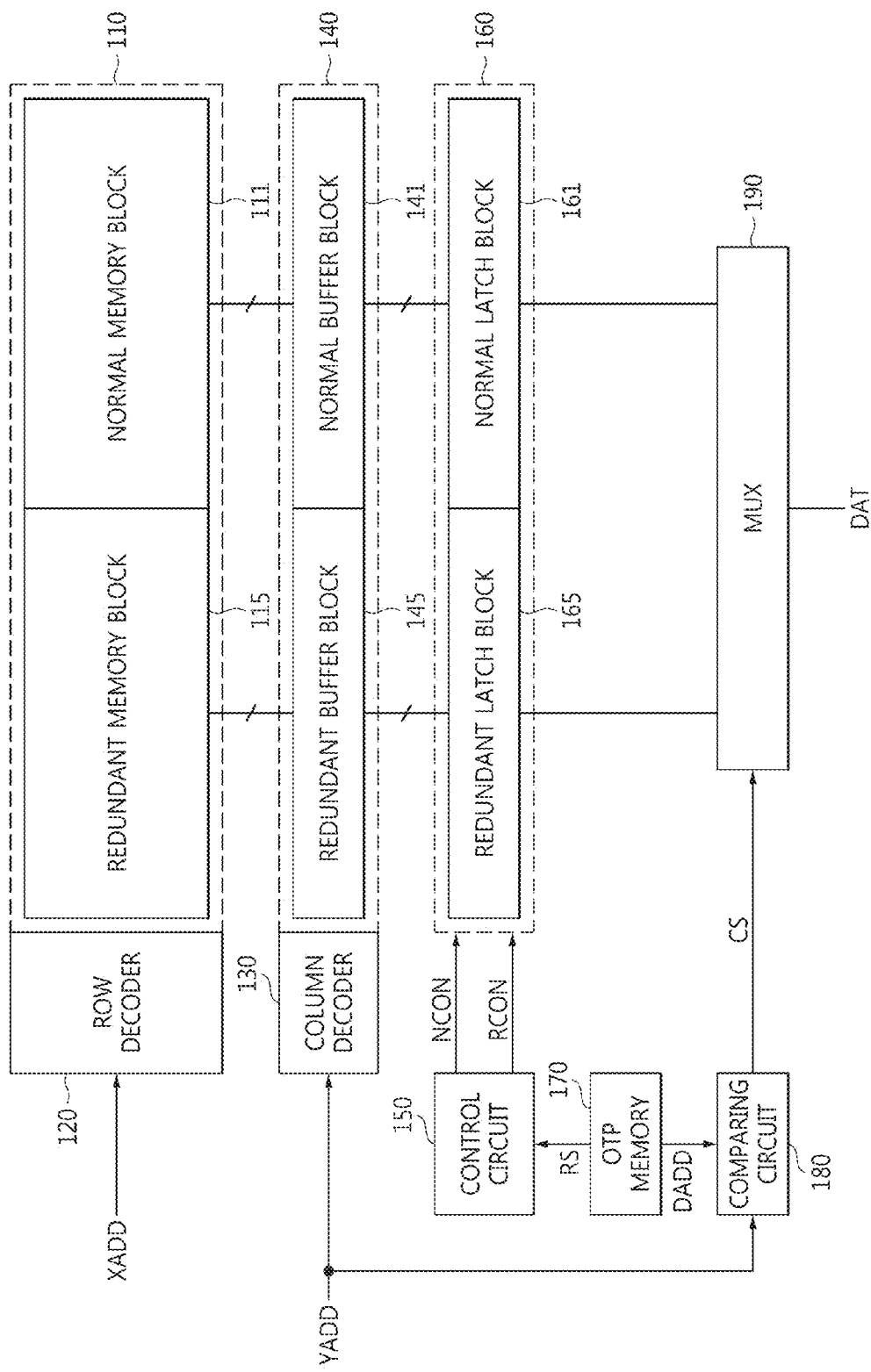
FIG. 3 is a block diagram of a semiconductor memory device according to some example embodiments of the inventive concepts.

FIG. 3 is a block diagram of the semiconductor memory device 100 according to some example embodiments of the inventive concepts.

Referring to FIG. 3, the semiconductor memory device 100 is shown as an example of the semiconductor memory devices 100, 100', and 100" illustrated in FIG. 1.

The semiconductor memory device 100 may include a memory cell array 110, a row decoder 120, a column decoder 130, a sense amplifier 140, a control circuit 150, a latch block 160, one time programmable (OTP) memory 170, a comparing circuit 180, and a multiplexer (MUX) 190. Although not shown in FIG. 3, the semiconductor memory device 100 may also include an address buffer, an input/output (I/O) circuit, a write driver, and a bit line precharge circuit. Further, the semiconductor memory device 100 may also include other elements in addition to those discussed supra.

The memory cell array 110 may include a normal memory block 111 and a redundant memory block 115. The normal memory block 111 may include a plurality of normal memory cells (not shown). The redundant memory block 115 may include a plurality of redundant memory cells (not shown).

Hereinafter, a cell in which fail occurs among the normal memory cells is referred to as a defective cell. A cell which stores data in place of a defective cell among the redundant memory cells is referred to as a repair cell. The defective cell may have a corresponding repair cell. There may be a plurality of defective cells and a plurality of repair cells. The defective cell may be a memory cell in which fail occurs during the test of the semiconductor memory device 100 and the repair cell may store data in place of the defective cell.

Although not shown in FIG. 3, each of all memory cells included in the memory cell array 110 may be connected to one of a plurality of word lines formed in a row direction and to one of a plurality of bit lines formed in a column direction. Accordingly, each memory cell may correspond to a row address XADD and a column address YADD. The row address XADD is an address in the row direction and the column address YADD is an address in the column direction. The row address XADD and the column address YADD may be signals stored in an address buffer (not shown).

The row decoder 120 may receive the row address XADD and may decode the row address XADD to designate a word line connected to a memory cell which data will be input to or output from. The semiconductor memory device 100 may also include a row driver (not shown) which enables a word line corresponding to the row address XADD based on a result of decoding the row address XADD. The row driver may be included in the row decoder 120. It is assumed hereinafter that the row decoder 120 has the function of the row driver. In other words, the row decoder 120 may decode the row address XADD and enable a word line corresponding to the row address XADD. For instance, when the row address XADD received by the row decoder 120 corresponds to a first word line, the row decoder 120 may enable the first word line.

The column decoder 130 may decode the column address YADD to designate a bit line connected to a memory cell which data will be input to or output from. The memory cell array 110 may read out data from or write data to a memory cell designated by the row address XADD and the column address YADD.

The sense amplifier 140 may sense and amplify a change in voltage of each bit line when the semiconductor memory device 100 performs a read operation. The sense amplifier 140 may include a write driver (not shown). The write driver may write data to a memory cell. However, example embodiments of the inventive concepts are not restricted thereto. The sense amplifier 140 may include a normal buffer block 141 and a redundant buffer block 145.

The normal buffer block 141 may sense and amplify data corresponding to the normal memory cells. The redundant buffer block 145 may sense and amplify data corresponding to the redundant memory cells. The control circuit 150 may control the latch block 160 and the MUX 190.

The control circuit 150 may output a plurality of control signals NCON and RCON to the latch block 160. The control signals NCON and RCON may include the normal control signal NCON and the redundant control signal RCON. The details related with the operation of the control circuit 150 will be described with reference to FIG. 4 later.

The latch block 160 may be enabled based on the control signals NCON and RCON received from the control circuit 150. When the latch block 160 is enabled in a read operation, the latch block 160 may receive data from the sense amplifier 140 and store the data therein. The latch block 160 may include n-bit latches, where "n" is an integer of at least 1. The latch block 160 may include a normal latch block 161 and a redundant latch block 165. The normal latch block 161 and the redundant latch block 165 may be 8-bit latches. The normal latch block 161 may access the normal buffer block 141 and the redundant latch block 165 may access the redundant buffer block 145, which will be described in detail with reference to FIG. 4 later.

The OTP memory 170 may store a repair signal RS and a defective address DADD. The OTP memory 170 may output the repair signal RS to the control circuit 150 (e.g., a logic gate 153 in FIG. 4 associated with the control circuit 150) and output the defective address DADD to the comparing circuit 180. The repair signal RS may correspond to the redundant latch block 165. In other words, the repair signal RS may indicate a redundant latch which has been assigned to a bit line connected to a repair cell among a plurality of redundant latches included in the redundant latch block 165. When the redundant latch block 165 is a 4-bit latch, which means that the redundant latch block 165 includes four latches, and the first one of the four latches is assigned to a bit line connected to a repair cell, then the repair signal RS may indicate "ON" for the first latch and "OFF" for the second through fourth ones of the four latches.

The repair signal RS may be a signal which is stored in the OTP memory 170 according to a test result of the semiconductor memory device 100.

As described above, a defective cell may be a memory cell in which fail occurs during the test of the semiconductor memory device 100 and the defective address DADD may be a signal which is stored in the OTP memory 170 according to the result of testing the semiconductor memory device 100.

The OTP memory 170 may be implemented using a fuse, an anti-fuse, or a laser fuse, but example embodiments of the inventive concepts are not restricted thereto. This will be described in detail with reference to FIG. 5 later.

The comparing circuit 180 may receive the column address YADD and the defective address DADD. The comparing circuit 180 may compare the column address YADD with the defective address DADD and may output a comparison signal CS to the MUX 190 based on the comparison result. The comparing circuit 180 may output the comparison signal CS such that the comparison signal CS instructs the MUX 190 to select the normal latch block 161, if the column address YADD is different from the defective address DADD, and instructs the MUX 190 to select the redundant latch block 165, if the column address YADD is the same as the defective address DADD.

For example, when the column address YADD is the same as the defective address DADD, the comparing circuit 180 may output the comparison signal CS at a high level. However, when the column address YADD is different from the defective address DADD, the comparing circuit 180 may output the comparison signal CS at a low level. However, example embodiments of the inventive concepts are not restricted thereto.

The MUX 190 may select one between the normal latch block 161 and the redundant latch block 165 based on the comparison signal CS received from the comparing circuit 180. In a read operation, the MUX 190 may select the redundant latch block 165 when the comparison signal CS is at the high level and may select the normal latch block 161 when the comparison signal CS is at the low level. Data stored in either the normal latch block 161 or the redundant latch block 165 which is selected by the MUX 190 may be output to the I/O circuit.

The write driver may drive the bit lines included in the memory cell array 110 when the semiconductor memory device 100 performs a write operation.

Data read from the memory cell array 110 based on the address signals XADD and YADD may be output to the memory controller 200 through the I/O circuit.

Figure 4:
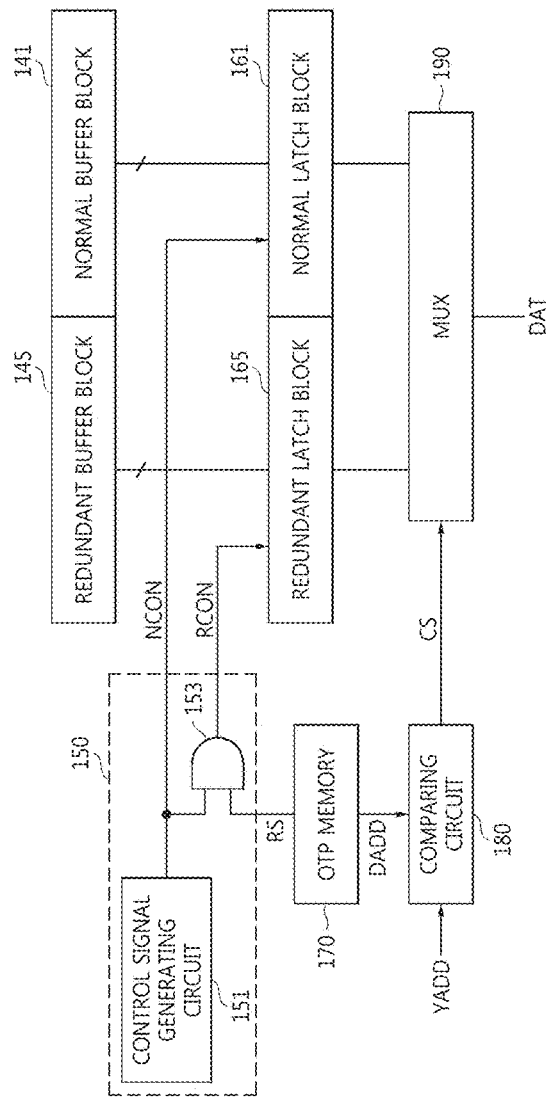
FIG. 4 is a detailed block diagram of a control circuit according to some example embodiments of the inventive concepts.

FIG. 4 is a detailed block diagram of the control circuit 150 according to some example embodiments of the inventive concepts.

Referring to FIG. 4, the control circuit 150 may include a control signal generating circuit 151 and the logic gate 153. Although the logic gate 153 is an AND gate in the example embodiments illustrated in FIG. 4, example embodiments of the inventive concepts are not restricted thereto. It is assumed hereinafter that the logic gate 153 is an AND gate for convenience' sake in the description.

The control signal generating circuit 151 may generate and output the normal control signal NCON to the normal latch block 161. The control signal generating circuit 151 may also output the normal control signal NCON to the logic gate 153.

The normal latch block 161 may be enabled based on the normal control signal NCON. In a read operation, the normal latch block 161 which has been enabled may receive data from the normal buffer block 141 and store the data.

The logic gate 153 may receive the normal control signal NCON and the repair signal RS. The logic gate 153 may perform a logic operation (e.g., an AND operation) on the normal control signal NCON and the repair signal RS to generate the redundant control signal RCON. Unlike the normal control signal NCON, the redundant control signal RCON may allow the redundant latch block 165 to receive and store data only from a bit line connected to a repair cell. The logic gate 153 may output the redundant control signal RCON to the redundant latch block 165.

The redundant latch block 165 may be enabled based on the redundant control signal RCON. In a read operation, the redundant latch block 165 which has been enabled may selectively receive and store data from the redundant buffer block 145.

Although the logic gate 153 is separated from the control signal generating circuit 151 in the example embodiments illustrated in FIG. 4, example embodiments of the inventive concepts are not restricted thereto. For example, the control signal generating circuit 151 may include the logic gate 153 and may directly generate the redundant control signal RCON in other embodiments.

Further, in some example embodiments the control circuit 150 may be a controller, which includes a processor and a memory.

The memory may be a computer readable storage medium that generally includes a random access memory (RAM), read only memory (ROM), and/or a permanent mass storage device, such as a disk drive.

The processor may be implemented by at least one semiconductor chip disposed on a printed circuit board. The processor may be an arithmetic logic unit, a digital signal processor, a microcomputer, a field programmable array, a programmable logic unit, a microprocessor or any other device capable of responding to and executing instructions in a defined manner.

The processor may be programmed with instructions that configure the processor 230 into a special purpose computer to perform the operations of one or more of the control signal generating circuit 151, the logic gate 153, and the comparing circuit 180. For example, the processor may provide a redundant control signal to ones of the plurality of redundant latches RL based on a repair signal RS that indicates which of the plurality of redundant latches RL are connected to repair cells RC in the redundant buffer block 145. Further, the processor may provide a comparison signal to the MUX 190 based on a defective address associated with the repair cells RC and a read address YADD received from a decoder.

The operations of the latch block 160 and the MUX 190 based on the control signals NCON and RCON output from the control circuit 150 will be described below. For convenience' sake in the description, it is assumed that the semiconductor memory device 100 performs a read operation, but example embodiments of the inventive concepts are not restricted thereto.

The normal latch block 161 included in the latch block 160 may receive the normal control signal NCON. The normal latch block 161 may fetch data from the normal buffer block 141 based on the normal control signal NCON and store the data.

The redundant latch block 165 included in the latch block 160 may receive the redundant control signal RCON. The redundant latch block 165 may selectively fetch data from the redundant buffer block 145 based on the redundant control signal RCON and store the data. In other words, unlike the normal latch block 161, the redundant latch block 165 may selectively fetch and store data in order to store data only stored in a repair cell.

The MUX 190 may select one between the normal latch block 161 and the redundant latch block 165 based on the comparison signal CS. When the comparison signal CS is at the high level, the MUX 190 may select the redundant latch block 165 and transmit data from the redundant latch block 165 to the I/O circuit. However, when comparison signal CS is at the low level, the MUX 190 may select the normal latch block 161 and transmit data from the normal latch block 161 to the I/O circuit. However, example embodiments are not limited thereto.

Figure 5:
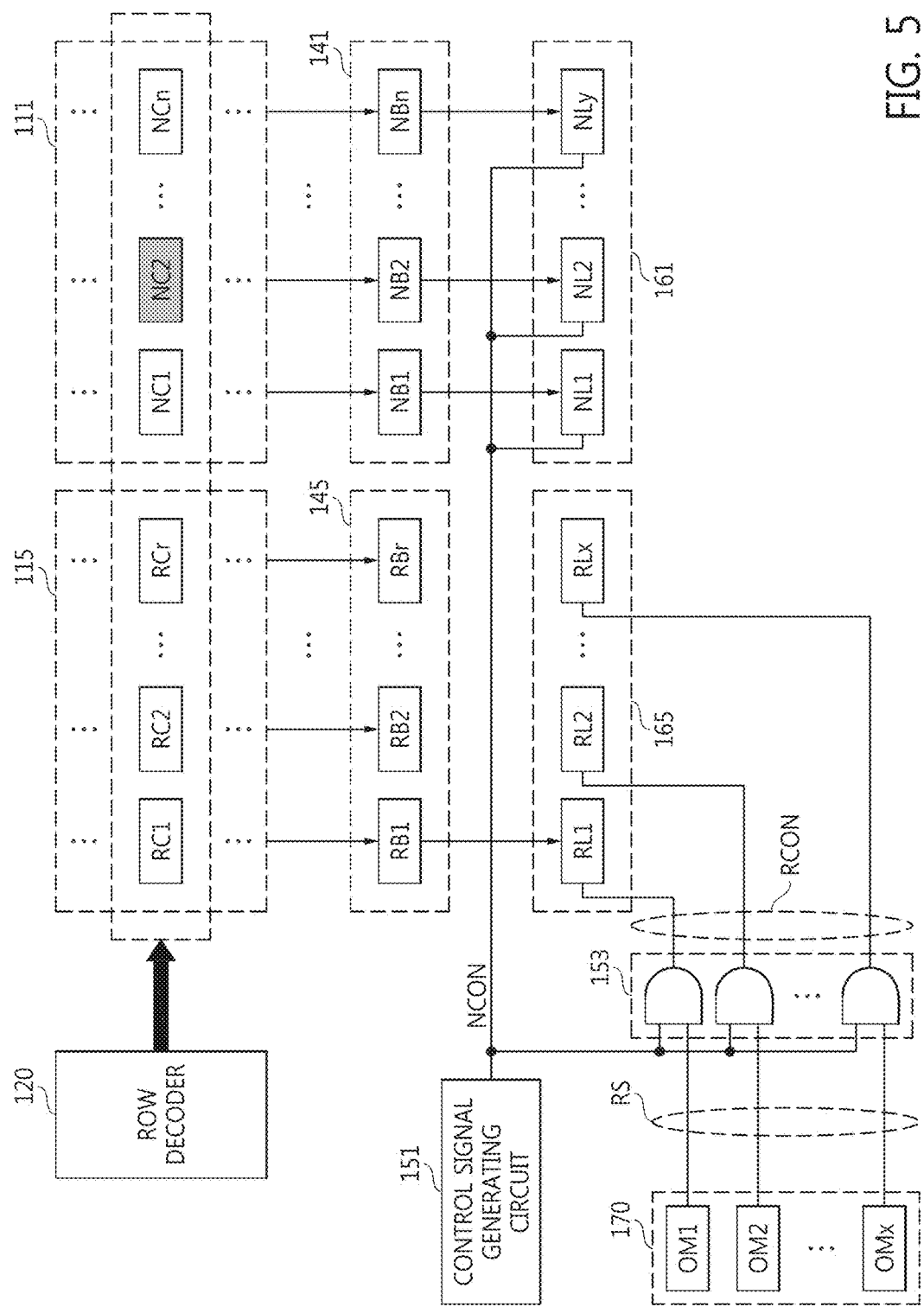
FIG. 5 is detailed block diagram of the operation of a semiconductor memory device according to some example embodiments of the inventive concepts.

FIG. 5 is detailed block diagram of the operation of the semiconductor memory device 100 according to some example embodiments of the inventive concepts.

Referring to FIGS. 3 and 5, it is assumed in the example embodiment described with reference to FIG. 5, that the semiconductor memory device 100 performs a read operation, but example embodiments of the inventive concepts are not restricted thereto.

As described above, the row decoder 120 may enable one particular word line in the memory cell array 110. It is assumed hereinafter that the particular word line has been enabled by the row decoder 120.

The word line enabled by the row decoder 120 may be connected to a plurality of redundant memory cells RC1 through RCr, where "r" is an integer of at least 3, and to a plurality of normal memory cells NC1 through NCn, where "n" is an integer of at least 3. Each memory cell illustrated in FIG. 5 may be a unit cell which store 1-bit data. It is assumed that the second normal memory cell NC2 is a defective cell in the normal memory block 111 and the first redundant memory cell RC1 in the redundant memory block 115 is a repair cell replacing the defective cell.

The sense amplifier 140 may sense and amplify data stored in the memory cell array 110 according to the control of the column decoder 130. In detail, redundant buffers RB1 through RBr included in the redundant buffer block 145 may sense and amplify data stored in redundant memory cells RC1 through RCr, respectively. Normal buffers NB1 through NBn included in the normal buffer block 141 may sense and amplify data stored in normal memory cells NC1 through NCr, respectively. Each buffer illustrated in FIG. 5 may be a unit buffer which processes one bit.

The latch block 160 may fetch data from the normal buffer block 141 and the redundant buffer block 145 based on the control signals NCON and RCON received from the control signal generating circuit 151 and may store the data. In detail, normal latches NL1 through NLy (where "y" is an integer of at least 3) included in the normal latch block 161 may fetch data from the normal buffers NB1 through NBn, respectively, based on the normal control signal NCON and may store the data. Redundant latches RL1 through RLx included in the redundant latch block 165 may selectively fetch data from the redundant buffers RB1 through RBr, respectively, based on the redundant control signal RCON and may store the data. Each latch illustrated in FIG. 5 may be a unit latch which stores one bit.

Although the number of buffers is the same as the number of latches in the embodiments illustrated in FIG. 5, example embodiments of the inventive concepts are not restricted thereto. For example, the normal latch block 161 and the redundant latch block 165 may include two, four, eight or sixteen unit latches.

The OTP memory 170 may store the repair signal RS. The repair signal RS may correspond to the redundant latch block 165. In other words, the repair signal RS may indicate a redundant latch assigned to a bit line connected to a repair cell among the redundant latches RL1 through RLx included in the redundant latch block 165. The repair signal RS may be a signal which is stored in the OTP memory 170 according to a test result of the semiconductor memory device 100.

The OTP memory 170 may include a plurality of unit memories OM1 through OMx, which may correspond to the redundant latches RL1 through RLx, respectively. Accordingly, each of the redundant latches RL1 through RLx may operate according to a signal stored in a corresponding one of the unit memories OM1 through OMx. For instance, when a signal stored in the first unit memory OM1 is at a high level, the corresponding redundant control signal RCON may be at a high level. However, when a signal stored in the second unit memory OM2 is at a low level, the corresponding redundant control signal RCON may be at a low level.

A signal at a high level may be stored in a unit memory corresponding to a bit line connected to a repair cell and a signal at a low level may be stored in the other unit memories. Referring to FIG. 5, the signal at the high level may be stored in the first unit memory OM1 corresponding to the bit line connected to the repair cell RC1 and the signal at the low level may be stored in the other unit memories OM2 through OMx.

The logic gate 153 may include a plurality of AND gates. The logic gate 153 may perform an AND operation on the normal control signal NCON and the repair signal RS to generate the redundant control signal RCON. As described above, since the first unit memory OM1 outputs the signal at the high level, only the first redundant latch RL1 selectively fetches data from the first redundant buffer RB1 according to the result of the AND operation and stores the data. Since the other unit memories OM2 through OMx output the signal at the low level, the other redundant latches RL2 through RLx do not fetch data according to the result of the AND operation.

Figure 6:
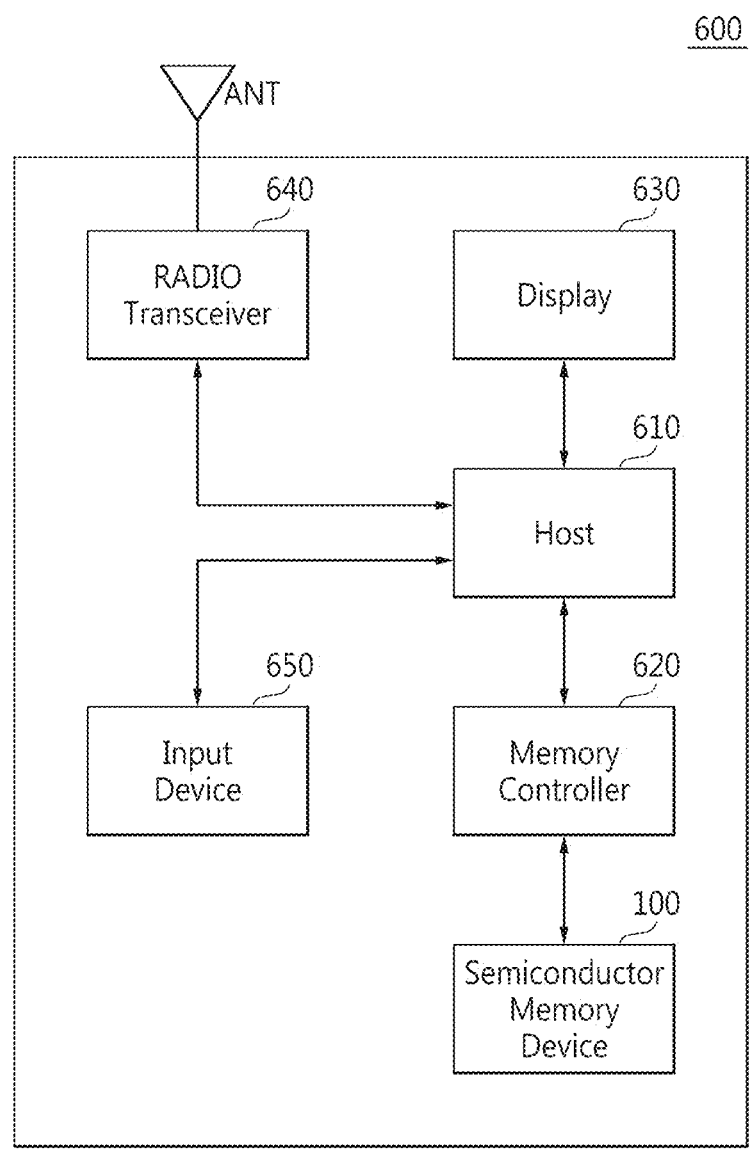
FIG. 6 is a diagram of a computer system including the semiconductor memory device illustrated in FIG. 3 according to some example embodiments of the inventive concepts.

FIG. 6 is a diagram of a computer system 600 including the semiconductor memory device 100 illustrated in FIG. 3 according to some example embodiments of the inventive concepts.

Referring to FIG. 6, the computer system 600 may be implemented as a cellular phone, a smart phone, a personal digital assistant (PDA), and/or a wireless communication device. However, example embodiments are not limited thereto.

The computer system 600 may include the semiconductor memory device 100 and a memory controller 620 controlling the operation of the semiconductor memory device 100. For example, the memory controller 620 may control a data access operation, e.g., a write operation or a read operation, of the semiconductor memory device 100 according to the control of a host 610.

Data of the semiconductor memory device 100 may be displayed through a display 630 according to the control of the host 610 and the memory controller 620. A radio transceiver 640 may transmit or receive radio signals through an antenna ANT. The radio transceiver 640 may convert radio signals received through the antenna ANT into signals that can be processed by the host 610. Accordingly, the host 610 may process the signals output from the radio transceiver 640 and transmit the processed signals to the memory controller 620 or the display 630. The memory controller 620 may store the signals processed by the host 610 in the semiconductor memory device 100. The radio transceiver 640 may also convert signals output from the host 610 into radio signals and output the radio signals to an external device through the antenna ANT.

An input device 650 enables control signals for controlling the operation of the host 610 or data to be processed by the host 610 to be input to the semiconductor memory device 100. The input device 650 may be implemented as a pointing device such as a touch pad or a computer mouse, a keypad, or a keyboard.

The host 610 may control the operation of the display 630 to display data output from the memory controller 620, data output from the radio transceiver 640, or data output from the input device 650. The memory controller 620, which controls the operations of the semiconductor memory device 100, may be implemented as a part of the host 610 or as a separate chip.

Figure 7:
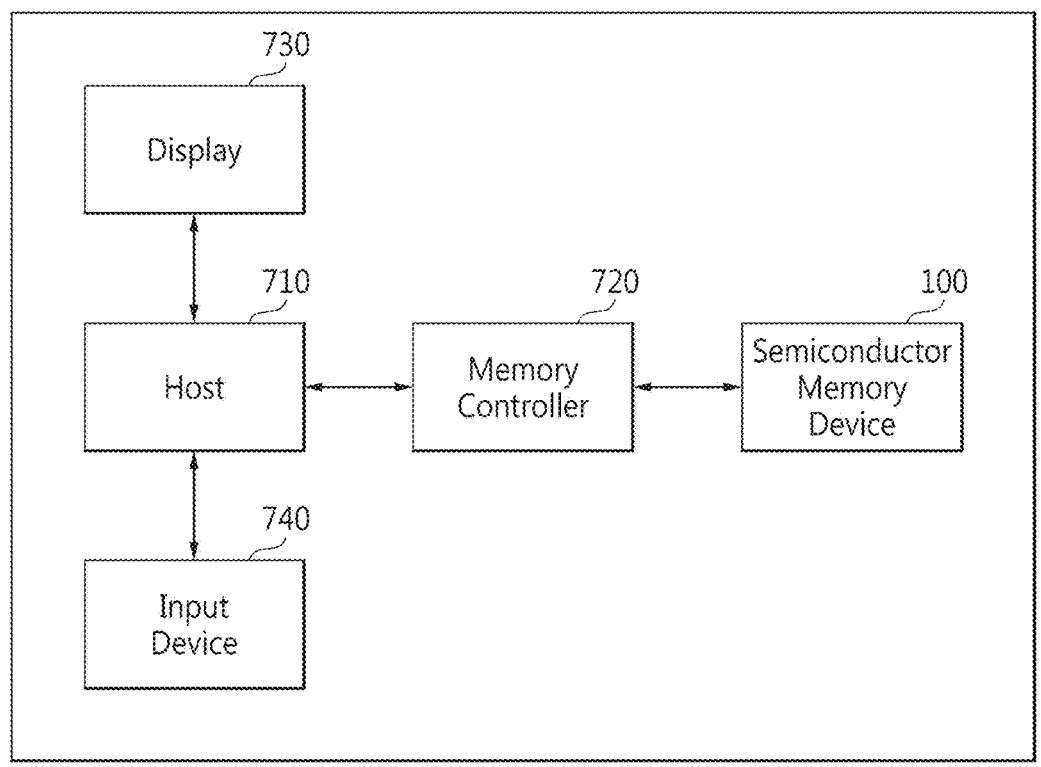
FIG. 7 is a block diagram of a computer system including the semiconductor memory device illustrated in FIG. 3 according to other example embodiments of the inventive concepts.

FIG. 7 is a block diagram of a computer system 700 including the semiconductor memory device 100 illustrated in FIG. 3 according to other example embodiments of the inventive concepts.

Referring to FIG. 7, the computer system 700 may be implemented as a personal computer (PC), a tablet PC, a net-book, an e-reader, a personal digital assistant (PDA), a portable multimedia player (PMP), an MP3 player, and/or an MP4 player. However, example embodiments are not limited thereto.

The computer system 700 may include a host 710, the semiconductor memory device 100, a memory controller 720 controlling the data processing operations of the semiconductor memory device 100, a display 730 and an input device 740.

The host 710 may display data stored in the semiconductor memory device 100 through the display 730 according to data input through the input device 740. The input device 740 may be implemented by a pointing device such as a touch pad or a computer mouse, a keypad, and/or a keyboard.

The host 710 may control the overall operation of the computer system 700 and the operations of the memory controller 720.

According to some example embodiments, the memory controller 720, which may control the operations of the semiconductor memory device 100, may be implemented as a part of the host 710 or as a separate chip.

Figure 8:
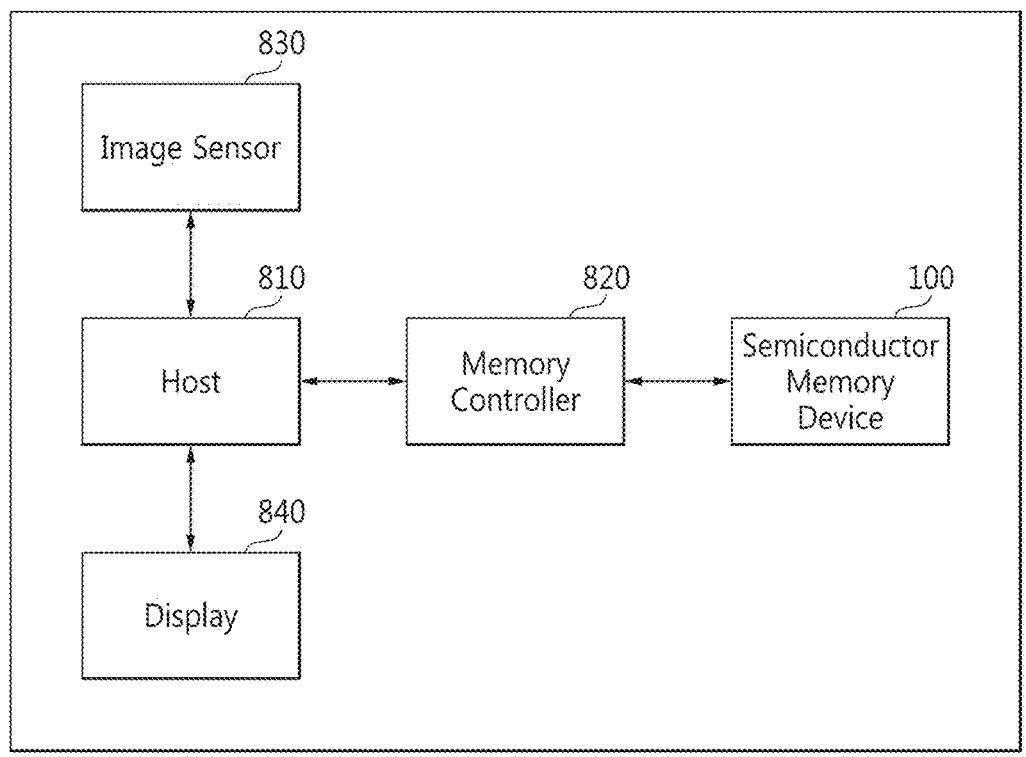
FIG. 8 is a block diagram of a computer system including the semiconductor memory device illustrated in FIG. 3 according to further example embodiments of the inventive concepts.

FIG. 8 is a block diagram of a computer system 800 including the semiconductor memory device 100 illustrated in FIG. 3 according to further example embodiments of the inventive concepts.

Referring to FIG. 8, the computer system 800 may be implemented as an image processing device like a digital camera, a cellular phone equipped with a digital camera, and/or a smart phone equipped with a digital camera. However, example embodiments are not limited thereto.

The computer system 800 includes a host 810, the semiconductor memory device 100 and a memory controller 820 controlling the data processing operations, such as a write operation or a read operation, of the semiconductor memory device 100. The computer system 800 further includes an image sensor 830 and a display 840.

The image sensor 830 included in the computer system 800 converts optical images into digital signals and outputs the digital signals to the host 810 or the memory controller 820. The digital signals may be controlled by the host 810 to be displayed through the display 840 or stored in the semiconductor memory device 100 through the memory controller 820.

Data stored in the semiconductor memory device 100 may be displayed through the display 840 according to the control of the host 810 or the memory controller 820. The memory controller 820, which may control the operations of the semiconductor memory device 100, may be implemented as a part of the host 810 or as a separate chip.

Figure 9:
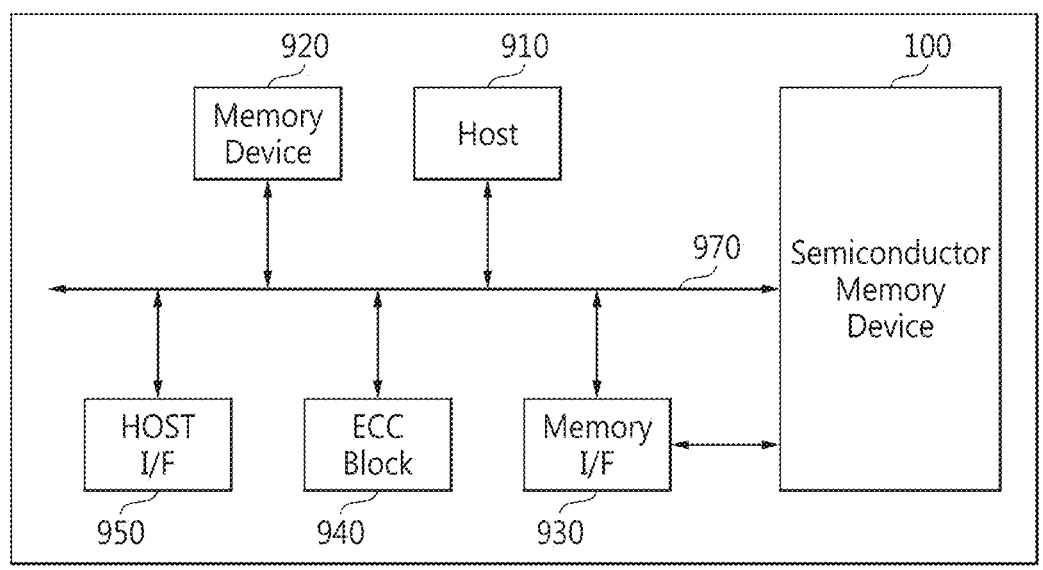
FIG. 9 is a block diagram of a computer system including the semiconductor memory device illustrated in FIG. 3 according to yet other example embodiments of the inventive concepts.

FIG. 9 is a block diagram of a computer system 900 including the semiconductor memory device 100 illustrated in FIG. 3 according to yet other example embodiments of the inventive concepts.

Referring to FIG. 9, the computer system 900 includes the semiconductor memory device 100 and a host 910 controlling the operations of the semiconductor memory device 100.

The computer system 900 also includes a system memory 920, a memory interface 930, an error correction code (ECC) block 940, and/or a host interface 950.

The system memory 920 may be used an operation memory of the host 910. The system memory 920 may be implemented by a non-volatile memory like read-only memory (ROM) or a volatile memory like static random access memory (SRAM).

The host 910 connected with the computer system 900 may perform data communication with the semiconductor memory device 100 through the memory interface 930 and the host interface 950.

The ECC block 940 is controlled by the host 910 to detect an error bit included in data output from the semiconductor memory device 100 through the memory interface 930, correct the error bit, and transmit the error-corrected data to the host through the host interface 950. The host 910 may control data communication among the memory interface 930, the ECC block 940, the host interface 950, and the system memory 920 through a bus 770. The computer system 900 may be implemented as a flash memory drive, a USB memory drive, an IC-USB memory drive, or a memory stick.

Figure 10:
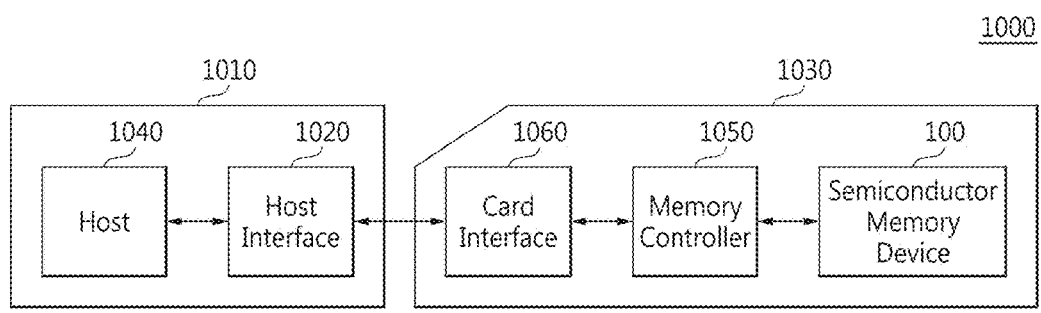
FIG. 10 is a block diagram of a computer system including the semiconductor memory device illustrated in FIG. 3 according to still other example embodiments of the inventive concepts.

FIG. 10 is a block diagram of a computer system 1000 including the semiconductor memory device 100 illustrated in FIG. 3 according to still other embodiments of the inventive concept.

Referring to FIG. 10, the computer system 1000 may be implemented as a host computer 1010 and a memory card or a smart card. The computer system 1000 includes the host computer 1010 and the memory card 1030.

The host computer 1010 includes a host 1040 and a host interface 1020. The memory card 1030 includes the semiconductor memory device 100, a memory controller 1050, and a card interface 1060. The memory controller 1050 may control data exchange between the semiconductor memory device 100 and the card interface 1060.

According to some example embodiments, the card interface 1060 may be a secure digital (SD) card interface or a multi-media card (MMC) interface, but example embodiments of the inventive concepts are not restricted thereto.

When the memory card 1030 is installed into the host computer 1010, the card interface 1060 may interface the host 1040 and the memory controller 1050 for data exchange according to a protocol of the host 1040. The card interface 1060 may support a universal serial bus (USB) protocol and an interchip (IC)-USB protocol. Here, the card interface 1060 may indicate a hardware supporting a protocol used by the host 330, a software installed in the hardware, or a signal transmission mode.

When the computer system 1000 is connected with the host interface 1020 of the host computer 1010 such as a PC, a tablet PC, a digital camera, a digital audio player, a cellular phone, a console video game hardware, or a digital set-top box, the host interface 1020 may perform data communication with the semiconductor memory device 100 through the card interface 1060 and the memory controller 1050 according to the control of the host 1040.

Figure 11:
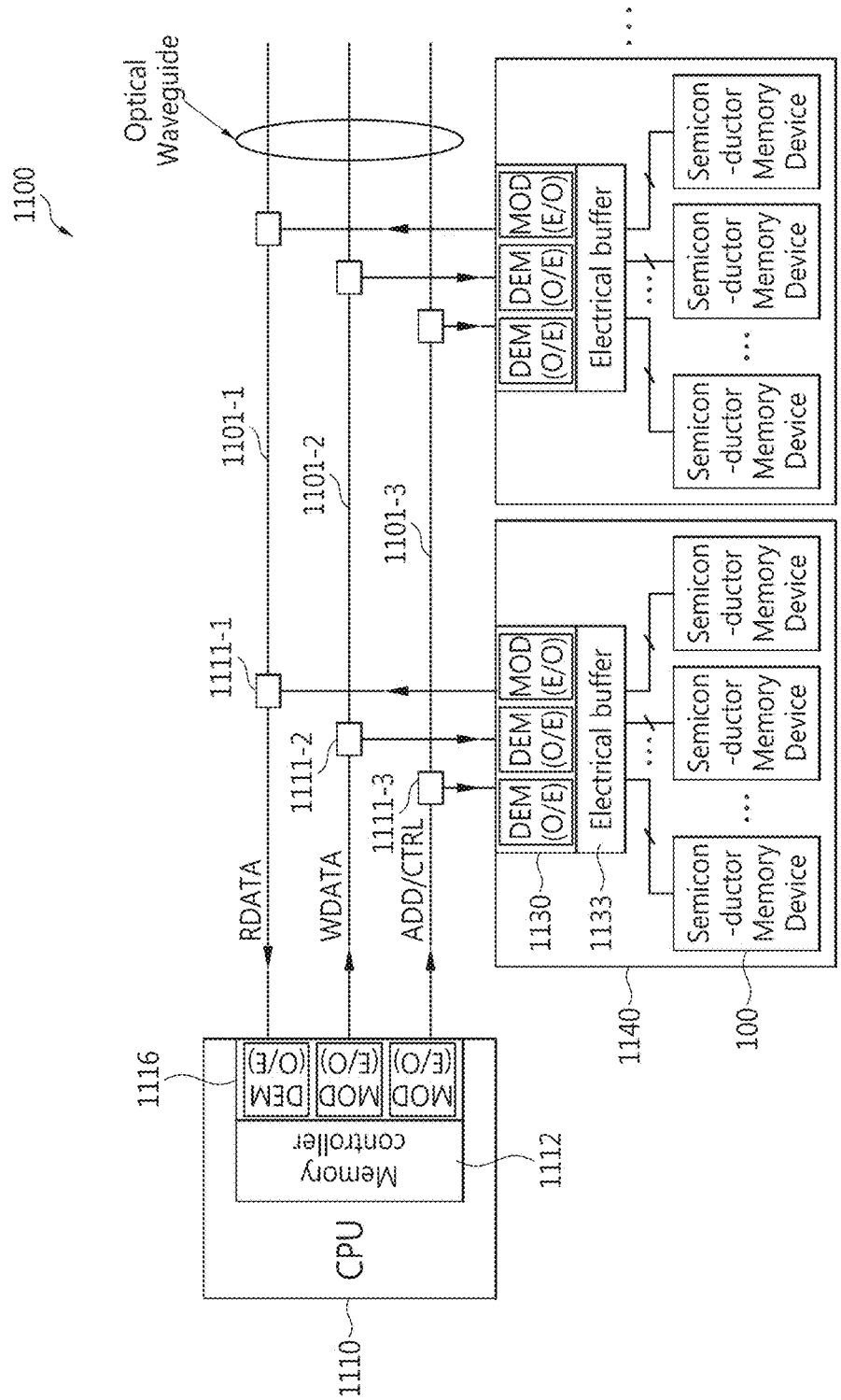
FIG. 11 is a block diagram of a data processing system 1100 including the semiconductor memory device 100 illustrated in FIG. 3 according to some example embodiments of the inventive concepts.

FIG. 11 is a block diagram of a data processing system 1100 including the semiconductor memory device 100 illustrated in FIG. 3 according to some embodiments of the inventive concept.

Referring to FIG. 11, in FIG. 11, MOD(E/O) denotes an optical modulator used as an electrical-to-optical (E/O) converter which converts an electrical signal to an optical signal, and DEM(O/E) denotes an optical demodulator used as an optical-to-electrical (O/E) converter which converts an optical signal to an electrical signal.

The data processing system 1100 may include a central processing unit (CPU) 1110, a plurality of data buses 1101-1, 1101-2, and 1101-3, and a plurality of memory modules 1140.

Each of the memory modules 1140 may transmit and receive optical signals through a plurality of couplers 1111-1, 1111-2, and 1111-3 respectively connected to the data buses 1101-1 through 1101-3. According to some embodiments, each of the couplers 1011-1 through 1011-3 may be implemented by an electrical coupler or an optical coupler.

The CPU 1110 includes a first optical transceiver 1116, which includes at least one optical modulator MOD(E/O) and at least one optical demodulator DEM(O/E), and a memory controller 1112. The optical demodulator DEM(O/E) is used as the O/E converter. The memory controller 1112 is controlled by the CPU 1110 to control the operations, e.g., the transmitting operation and the receiving operation, of the first optical transceiver 1116.

For instance, during a write operation, a first optical modulator MOD(E/O) of the first optical transceiver 1116 generates a modulated optical signal ADD/CTRL from addresses and control signals and transmits the optical signal ADD/CTRL, to the optical communication bus 1101-3 in compliance with the memory controller 1112.

After the first optical transceiver 1116 transmits the optical signal ADD/CTRL to the optical communication bus 1101-3, a second optical modulator MOD(E/O) of the first optical transceiver 1116 may generate modulated optical write data WDATA and transmit the optical write data WDATA to the data bus 1101-2.

Each of the memory modules 1140 includes a second optical transceiver 1130 and a plurality of memory devices 100. Each memory module 1140 may be implemented by an optical dual in-line memory module (DIMM), an optical fully buffered DIMM, an optical small outline dual in-line memory module (SO-DIMM), an optical registered DIMM (RDIMM), an optical load reduced DIMM (LRDIMM), an optical unbuffered DIMM (UDIMM), an optical micro DIMM, or an optical single in-line memory module (SIMM).

Referring to FIG. 11, an optical demodulator DEM(O/E) included in the second optical transceiver 1130 demodulates the optical write data WDATA received through the data bus 1101-2 and transmits a demodulated electrical signal to at least one of the memory devices 100.

Each memory module 1140 may also include an electrical buffer 1133 which buffers an electrical signal output from an optical demodulator DEM(O/E). For instance, the electrical buffer 1133 may buffer a demodulated electrical signal, and may transmit the buffered electrical signal to at least one of the memory devices 100.

During a read operation, an electrical signal output from the memory device 100 is modulated into optical read data RDATA by an optical modulator MOD(E/O) included in the second optical transceiver 1130. The optical read data RDATA is transmitted to a first optical demodulator DEM(O/E) included in the CPU 1110 through the data bus 1101-1. The first optical demodulator DEM(O/E) demodulates the optical read data RDATA and transmits a demodulated electrical signal to the memory controller 1112.

Figure 12:
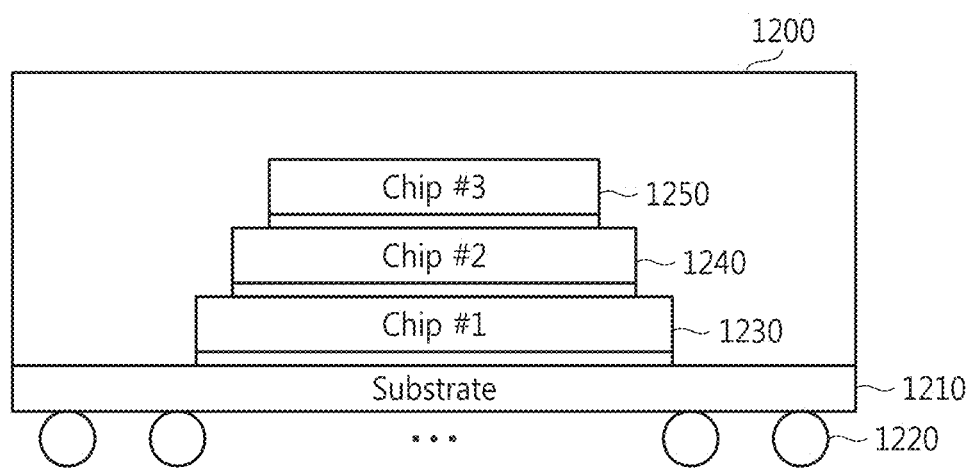
FIG. 12 is a schematic conceptual diagram of a multi-chip package including the semiconductor memory device illustrated in FIG. 3.

FIG. 12 is a schematic conceptual diagram of a multi-chip package 1200 including the semiconductor memory device 100 illustrated in FIG. 3.

Referring to FIG. 12, the multi-chip package 1200 may include a plurality of semiconductor devices, i.e., first through third chips 1230, 1240, and 1250 which are sequentially stacked on a package substrate 1110. Each of the semiconductor devices 1230 through 1250 may include the semiconductor memory device 100. A memory controller (not shown) for controlling the operations of the semiconductor devices 1230 through 1250 may be included within at least one of the semiconductor devices 1230 through 1250 or may be implemented on the package substrate 1110. A through-silicon via (TSV) (not shown), a bonding wire (not shown), a bump (not shown), or a solder ball 1120 may be used to electrically connect the semiconductor devices 1230 through 1250 with one other.

For one example, the first semiconductor device 1230 may be a logic die including an input/output interface and a memory controller and the second and third semiconductor devices 1240 and 1250 may be a die, on which a plurality of memory devices are stacked, and may include a memory cell array. At this time, a memory device of the second semiconductor device 1240 and a memory device of the third semiconductor device 1250 may be the same or different types of memory.

Alternatively, each of the first through third semiconductor devices 1230 through 1250 may include a memory controller. At this time, the memory controller may be on the same die as a memory cell array or may be on a different die than the memory cell array.

As another alternative, the first semiconductor device 1230 may include an optical interface. A memory controller may be positioned in the first or second semiconductor device 1230 or 1240 and a memory device may be positioned in the second or third semiconductor device 1240 or 1250. The memory device may be connected with the memory controller through a TSV.

The multi-chip package 1200 may be implemented using hybrid memory cube (HMC) in which a memory controller and a memory cell array die are stacked. When the HMC is used, the performance of memory devices increases due to the increase of bandwidth and the area of the memory devices is minimized. As a result, power consumption and manufacturing cost can be reduced.

Figure 13:
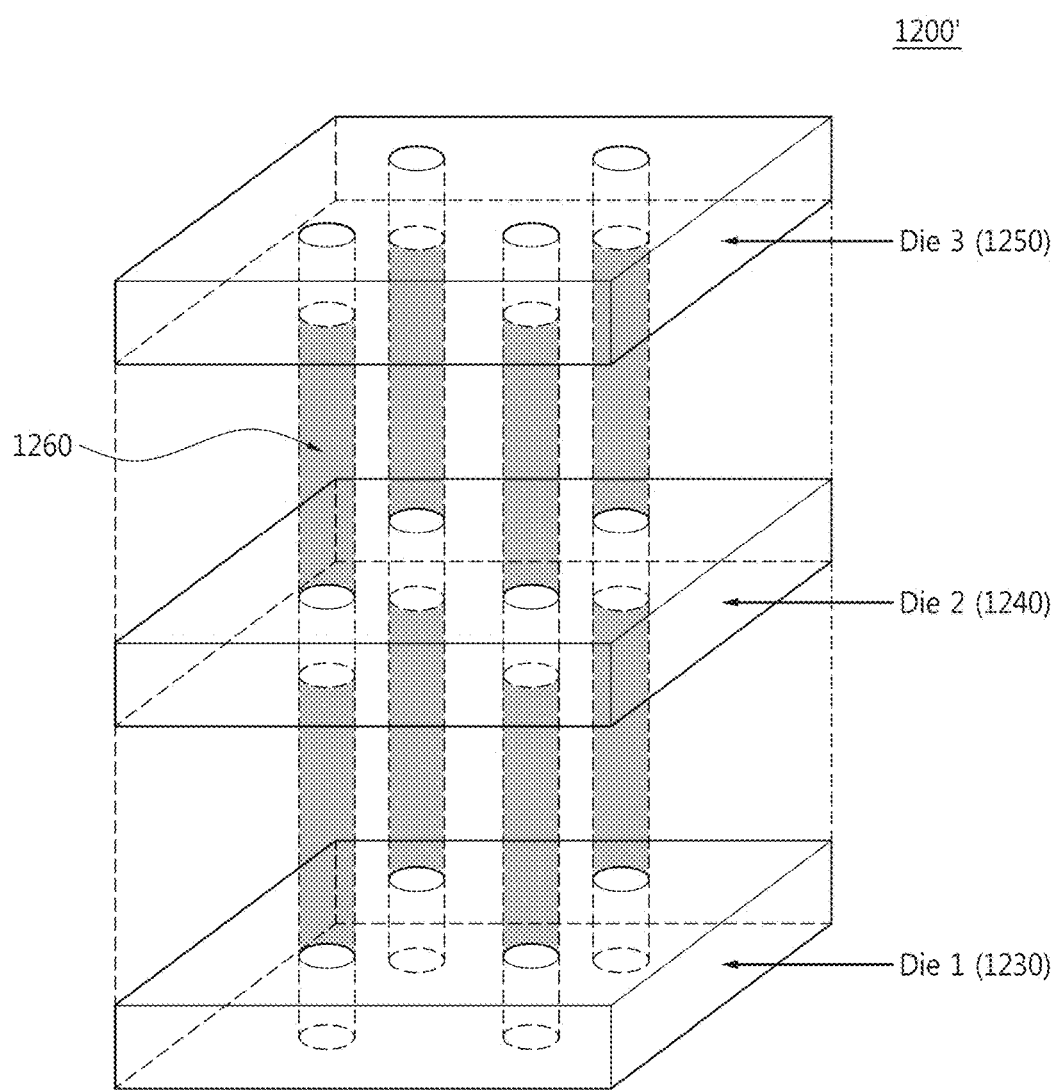
FIG. 13 is a three-dimensional conceptual diagram of an example of the multi-chip package illustrated in FIG. 12.

FIG. 13 is a three-dimensional conceptual diagram of an example 1200' of the multi-chip package 1200 illustrated in FIG. 12. Referring to FIG. 13, the multi-chip package 1200' includes a plurality of the dies 1230 through 1250 connected with one another through TSVs 1260 in a stack structure. Each of the dies 1230 through 1250 may include a plurality of circuit blocks (not shown) and a periphery circuit to realize the functions of the semiconductor memory device 100. The dies 1230 through 1250 may be referred to as a cell array. The plurality of circuit blocks may be implemented by memory blocks.

The TSVs 1260 may be formed of a conductive material including a metal such as copper (Cu). The TSVs 1260 are arranged at the center of a silicon substrate. The silicon substrate surrounds the TSVs 1260. An insulating region (not shown) may be disposed between the TSVs 1260 and the silicon substrate.

As described above, according to some example embodiments of the inventive concepts, a semiconductor memory device and/or a memory system including the same may selectively control the operation of redundant latches, thereby reducing power consumption.

While example embodiments of the inventive concepts have been particularly shown and described with reference to some example embodiments thereof, it will be understood by those of ordinary skill in the art that various changes in forms and details may be made therein without departing from the spirit and scope of the example embodiments of the inventive concepts as defined by the following claims.

What is claimed is:

1. A semiconductor memory device comprising:
a normal memory block including a plurality of normal memory cells;
a redundant memory block including a plurality of redundant memory cells, the plurality of redundant memory cells configured to replace defective cells among the normal memory cells;
a normal buffer block configured to sense and amplify normal data stored in the normal memory block;
a redundant buffer block configured to sense and amplify redundant data stored in the redundant memory block, the redundant buffer block including a plurality of redundant buffers;
a normal latch block configured to fetch the normal data from the normal buffer block and store the normal data based on a normal control signal; and
a redundant latch block including a plurality of redundant latches each configured to selectively fetch the redundant data from a respective one of the plurality of redundant buffers and store the redundant data based on whether a redundant control signal designates that respective ones of the plurality of redundant latches are active redundant latches, the active redundant latches being ones of the plurality of redundant latches corresponding to bit lines connected to repair cells.

2. The semiconductor memory device of claim 1, further comprising:
a control circuit configured to generate the normal control signal and the redundant control signal; and
a one-time programmable (OTP) memory configured to store a repair signal.

3. The semiconductor memory device of claim 2, wherein the control circuit comprises:
a control signal generating circuit configured to generate the normal control signal to the normal latch block; and
a logic gate configured to generate the redundant control signal by performing a logic operation on the normal control signal and the repair signal.

4. The semiconductor memory device of claim 3, wherein the OTP memory is configured to store the repair signal based on a test of the semiconductor memory device, the repair signal indicating the active redundant latches.

5. The semiconductor memory device of claim 4, wherein the normal buffer block includes a plurality of normal buffers,
the normal latch block includes a plurality of normal latches, each of the normal latches configured to store data from a corresponding one of the normal buffers based on the normal control signal.

6. The semiconductor memory device of claim 3, further comprising:
a circuit configured to output a control signal based on a defective address and a column address; and
a multiplexer configured to select one of the normal latch block and the redundant latch block based on the control signal.

7. The semiconductor memory device of claim 6, wherein the defective address is a signal stored in the OTP memory, the signal indicating the column address of one of the defective cells.

8. The semiconductor memory device of claim 3, wherein the logic gate comprises:
an AND gate configured to perform an AND operation on the normal control signal and the repair signal.

9. The semiconductor memory device of claim 1, wherein the plurality of redundant latches includes the active redundant latches and inactive redundant latches,
the redundant control signal designates the active redundant latches, and
the inactive redundant latches are configured not to receive and store data from corresponding redundant buffers.

10. A memory system comprising:
a plurality of semiconductor memory devices; and
a memory controller configured to control the semiconductor memory devices, wherein each of the semiconductor memory devices includes,
a memory cell array including a plurality of normal memory cells and a plurality of redundant memory cells, each of the plurality of redundant memory cells configured to replace a defective cell among the normal memory cells,
a sense amplifier configured to sense and amplify data stored in the memory cell array, the sense amplifier including a plurality of redundant buffers configured to sense and amplify data stored in the redundant memory cells,
a latch block configured to fetch and store data from the sense amplifier based on a normal control signal and a redundant control signal, the latch block including a plurality of redundant latches configured to selectively fetch redundant data from a respective one of the plurality of redundant buffers and store the redundant data based on whether the redundant control signal designates that respective ones of the plurality of redundant latches are active redundant latches, the active redundant latches being one of the plurality of redundant latches corresponding to bit lines connected to repair cells,
a control circuit configured to generate the normal control signal and the redundant control signal, and
a one time programmable (OTP) memory configured to store a repair signal.

11. The memory system of claim 10, wherein
the active redundant latches are configured to operate based on the redundant control signal, and
the active redundant latches are configured to selectively fetch and store data from a corresponding one of the plurality of redundant buffers.

12. The memory system of claim 11, wherein the control circuit comprises:
a control signal generating circuit configured to generate the normal control signal; and
a logic gate configured to generate the redundant control signal by performing a logic operation on the normal control signal and the repair signal.

13. The memory system of claim 12, wherein
the OTP memory is configured to store the repair signal based on a test of the semiconductor memory device, the repair signal indicating a redundant latch assigned to a bit line connected to a repair cell among the plurality of redundant latches.

14. The memory system of claim 12, wherein the OTP memory is one of a fuse, an anti-fuse, and a laser fuse.

15. A semiconductor memory device, comprising:
a latch block including a plurality of normal latches and a plurality of redundant latches, the plurality of redundant latches configured to selectively fetch redundant data from repair cells included in redundant memory cells based on a redundant control signal; and
a controller configured to selectively provide the redundant control signal to ones of the plurality of redundant latches based on a repair signal, the repair signal indicating which of the plurality of redundant latches are connected to the repair cells such that the controller is configured to selectively disable ones of the plurality of redundant latches not associated with the repair cells.

16. The semiconductor memory device of claim 15, wherein the plurality of normal latches are configured to fetch normal data from normal memory cells based on a normal control signal, the repair cells are configured to replace defective cells among the normal memory cells, and the controller is configured to selectively provide the redundant control signal to ones of the plurality of redundant latches, if the repair signal matches the normal control signal.

17. The semiconductor memory device of claim 16, wherein the controller is configured to generate a control signal based on a defective address associated with the repair cells and a read address received from a decoder, and the semiconductor memory device further comprises:

a multiplexer configured to read one of the normal data from the plurality of normal latches and the redundant data from the plurality of redundant latches based on the control signal.

18. The semiconductor memory device of claim 15, further comprising:

a one-time programmable (OTP) memory configured to store the repair signal.

19. The semiconductor memory device of claim 15, wherein the controller is configured to reduce power consumption by selectively disabling ones of the plurality of redundant latches not associated with the repair cells.

* * * * *